United States Patent [19]

Ono et al.

[11] Patent Number: 4,636,831

[45] Date of Patent: Jan. 13, 1987

[54] SEMICONDUCTOR DEVICE

[75] Inventors: Chikai Ono, Kawasaki; Yoshinori Okajima, Yokohama, both of Japan

[73] Assignee: Fujitsu Limited, Kawasaki, Japan

[21] Appl. No.: 517,256

[22] Filed: Jul. 26, 1983

[30] Foreign Application Priority Data

Aug. 2, 1982 [JP] Japan .................................. 57-133781

[51] Int. Cl.[4] .............................................. H01L 27/10
[52] U.S. Cl. ......................................... 357/45; 357/51
[58] Field of Search ...................... 357/45, 51, 40, 68; 338/295, 320, 333, 334

[56] References Cited

U.S. PATENT DOCUMENTS

| | | | |
|---|---|---|---|
| 3,312,871 | 4/1967 | Seki et al. .............................. | 357/45 |
| 3,900,811 | 8/1975 | Kurtz et al. ............................ | 357/26 |
| 3,943,551 | 3/1976 | Skorup .................................. | 357/51 |
| 4,127,840 | 11/1978 | House .................................... | 357/26 |
| 4,161,662 | 7/1979 | Malcolm et al. ....................... | 357/42 |
| 4,236,832 | 12/1980 | Komatsu et al. ....................... | 357/26 |

Primary Examiner—William D. Larkins
Assistant Examiner—Mark Prenty
Attorney, Agent, or Firm—Staas & Halsey

[57] ABSTRACT

A semiconductor device including a plurality of resistors. All the resistors are contained in circuit block regions which are arranged successively in a first direction. Each of the resistors is extended in the first direction. All of the resistors are set up in the form of a plurality of stages arranged in a second direction perpendicular to the first direction and in parallel with each other.

3 Claims, 11 Drawing Figures

SEMICONDUCTOR DEVICE

BACKGROUND OF THE INVENTION

1. Field of the Invention

The present invention relates to a semiconductor device having a high packaging density.

2. Description of the Prior Art

Demand for smaller size circuits and higher packaging density has been increasing in recent years. Such demand is particularly strong in the field of integrated circuits (IC's). Because of this, various techniques have been proposed for finely fabricating circuit elements.

The techniques for finely fabricating transistors and diodes have become considerably advanced. Techniques for fabricating transistors and diodes, however, cannot be applied to resistors. This is because each resistor must provide a specified design value of resistance. The resistance value is determined by the physical configuration of the resistor, e.g., its length and width. Therefore, the maintenance of a proper physical configuration takes priority over the fine fabrication of the resistor. This limits the degree of fine fabrication of resistors to some extent.

In the prior art, two methods have been proposed for arranging the resistors for fine fabrication. These methods, explained later, however, have certain problems. According to the first method, large dummy spaces are left between the resistors on the semiconductor substrate. According to the second method, the resistance value of each resistor cannot be obtained with a high degree of accuracy.

SUMMARY OF THE INVENTION

It is an object of the present invention to provide a semiconductor device wherein dummy spaces are minimized and a high degree of accuracy of each resistor is maintained, thus enabling high density packaging of the semiconductor device.

The above object is attained by an arrangement of resistors in which a plurality of circuit block regions and a plurality of resistors are provided. The circuit block regions are arranged, each having the same width P, successively in a first direction. Each of the resistors are arranged to extend in the first direction and each of the resistors has a length L, defined as $(n-1)P < L < nP$ (n is an integer satisfying the inequality $n \geq 2$), and all the resistors are set up in parallel on n stages arranged in a second direction perpendicular to the first direction.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Before describing the preferred embodiments, a discussion will be made regarding a semiconductor device to which the present invention is adapted. That is, the present invention deals with a semiconductor device including a plurality of resistors. The resistors are formed to correspond to a plurality of circuit blocks, arranged successively, each having a constant width P. The resistors have substantially the same resistance value. In addition, each resistor has a length L which is longer than the width P (L>P). Of the circuits comprised by such a plurality of circuit blocks, the most typical is a memory circuit.

Figure 1:
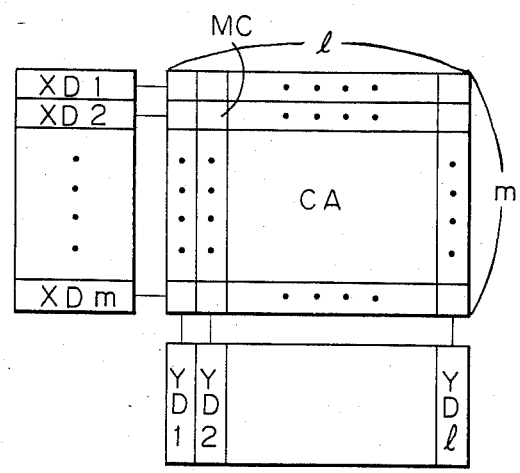
FIG. 1 is a schematic view of a memory circuit taken as an example to which the present invention is applied.

FIG. 1 is a schematic view of a memory circuit taken as an example to which the present invention is applied. In this figure, the characters CA represent a cell array, i.e., memory cell array, which is comprised of 1 x m numbers of memory cells MC arranged in a matrix. The cell array CA is provided with peripheral circuits, for example, X driver circuits XD1, XD2, —XDm and Y driver circuits YD1, YD2, —YDm. These circuits access a specified one of the memory cells MC. These X driver circuits and Y driver circuits correspond to the previously mentioned plurality of circuit blocks arranged successively and each having the same width P. Methods for arranging the resistors formed in correspondence with circuit blocks will be discussed below.

Figure 2:
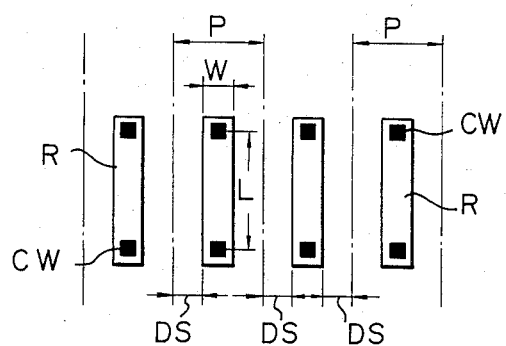
FIG. 2 is a plan view used for explaining a prior art method for arranging the resistors.

FIG. 2 is a plan view used for explaining a prior art method for arranging the resistors. In this figure, the regions separated by chain dotted lines are the regions occupied by the resistors allowed for and corresponding to the circuit blocks. That is, each region having the width P corresponds to one of the X driver circuits (XD) or one of the Y driver circuits (YD), both shown in FIG. 1. (It should be noted that only four regions are illustrated for simplicity.)

Each resistor R has a length L and a width W. Contact windows CW are formed at both ends thereof. The windows CW are connected with wirings (not shown). Incidentally, each resistor R may be a diffusion resistor, aluminum wiring resistor, or polysilicon resistor. Further, as previously mentioned, the relationships of L>P and W<P must apply. If the relationship of L<P applies, then the present invention is not necessary, because the resistors R could then be arranged laterally side by side in a single line, allowing highly dense packaging.

From FIG. 2, it will be apparent that, in the region allotted to each resistor R, considerably large idle spaces exist at the left and right sides. These spaces do not perform any function and are just dummy spaces DS. Such large dummy spaces DS make it difficult to achieve highly dense packaging of the circuit. Under such circumstances, a method has been proposed for reducing the size of the dummy spaces DS to some extent.

Figure 3A:
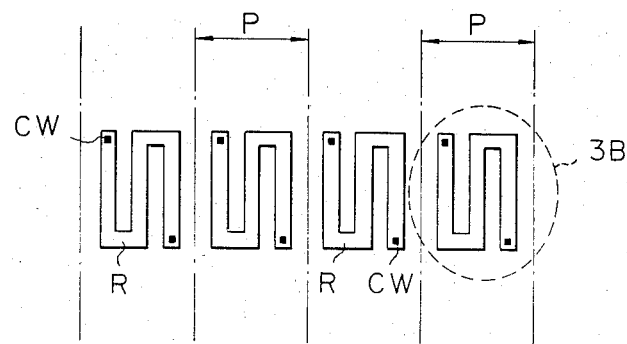
FIG. 3A is a plan view used for explaining a prior art method for making effective use of the dummy spaces shown in FIG. 2.
Figure 3B:
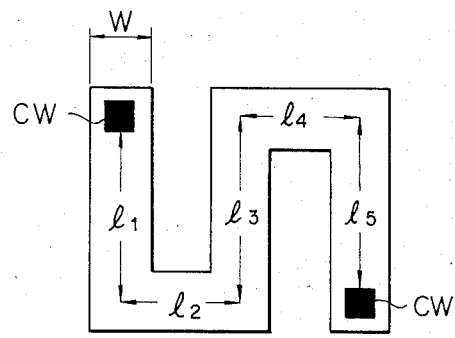
FIG. 3B is an enlarged plan view of an area enclosed by a broken line in FIG. 3A.

FIG. 3A is a plan view for explaining a prior art method for making effective use of the dummy spaces DS shown in FIG. 2. FIG. 3B is an enlarged plan view of an area enclosed by broken line 3B in FIG. 3A. In FIGS. 3A and 3B, members the same as those of FIG. 2 are represented by the same reference characters. As diagrammed, each resistor R of FIGS. 3A and 3B has a zig-zag configuration. This reduces the space of DS. Further, the length of each resistor R in the vertical direction of the figure (corresponding to "$l_3$" in FIG. 3B) can be made considerably shorter than the length L of the resistor in FIG. 2. The length L is expressed as L=l1+l2+l3+l4+l5. As a result, highly dense packaging of the circuit can be realized.

A resistor R of such a zig-zag configuration, however, is inconvenient in that the actual resistance value thereof will deviate from the predetermined design value due to the four bent portions. As known, a uniform electric field cannot be created at each bent portion. Therefore, the resistance value at each bent portion deviates from the desired resistance value which would be observed under a uniform electric field.

Figure 4:
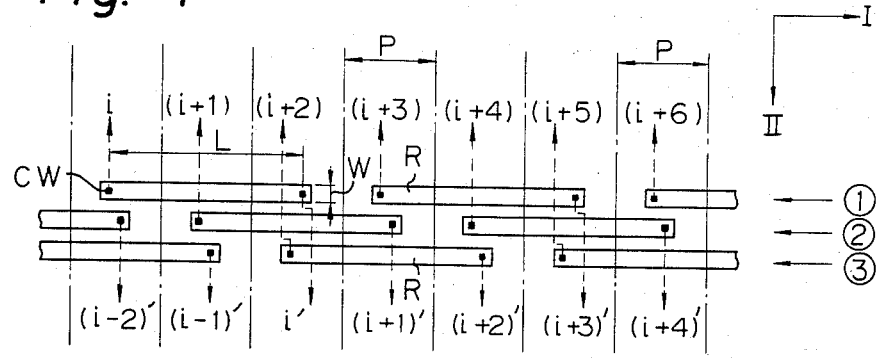
FIG. 4 is a plan view of a semiconductor device having a resistor arrangement according to a first embodiment of the present invention.

FIG. 4 is a plan view of a semiconductor device having a resistor arrangement according to a first embodiment of the present invention. In this figure, the regions separated by chain dotted lines are the same as those explained in reference to FIGS. 2 and 3A and correspond to the circuit blocks. Together these regions form the area where all the circuit blocks will be formed on the substrate. It should be noted, as previously mentioned, that the width of each region is P. Further, the resistors R are arranged as to all be contained inside the area the circuit blocks will occupy. In FIG. 4, however, not all the resistors R inside the area are completely illustrated.

Generally speaking, in the resistor arrangement pattern shown in FIG. 4, the resistors R are arranged in a single line, each resistor R spanning several successive circuit block regions. The thus arranged single-line plurality of resistors comprise one stage. Identical stages of the resistors are set up in parallel and close to each other. Here, the number (n) of the stages is determined first (n is a positive integer equal to or larger than 2), i.e., the length L and the width W of the resistor R are selected so as to result in a desired resistance value (design value of resistance), then the number n is determined so as to satisfy the relationship nP>L>(n−1)P. Next, the resistors R, each having the thus determined length L and width W, are arranged in a single line in a first direction (refer to arrow I in this figure) in which the circuit block regions are arranged successively, and spanning over successive circuit block regions without superposition on adjacent resistors R. After the plurality of resistors R arranged in a single line in the first direction I is defined as one stage, identical n number of stages (in this figure, three stages ①, ②, and ③ are set up in a close, parallel relationship in a second direction (refer to arrow II in this figure) perpendicular to the first direction I.

Comparing the thus arranged resistors R with the resistors R arranged as shown in FIG. 2, it will be understood that the useless dummy spaces DS shown in FIG. 2 can be considerably reduced. This means that highly dense packaging of a circuit can be realized. Further, it will also be understood that since each resistor R of FIG. 4 has a simple, straight configuration rather than a zig-zag configuration as in FIGS. 3A and 3B, the actual resistance value thereof can be almost the same as the design value and no deviation in value therebetween is produced. This guarantees highly accurate resistors.

The thus arranged resistors R are connected with desired wirings via contact windows CW formed at both ends thereof. It should be understood that the distribution of wirings is a matter of design choice and is outside the subject of the present invention. In this case, the wirings, of course, must not contact any other resistors R or wirings. Therefore, when the resistors are diffusion resistors, it is necessary to distribute the wirings on an insulation layer formed, in advance, on the surface of the substrate.

In FIG. 4, the wirings are indicated simply by broken arrows. For example, a resistor R having a wiring i at one end thereof is connected with another wiring i' at the other end thereof. These wirings i and i' are led, via predetermined wiring routes (not shown), to specified circuit portions to be connected therewith. This also applies to other wirings (i+1), (i+1)', (i+2), (i+2)',—.

Figure 5:
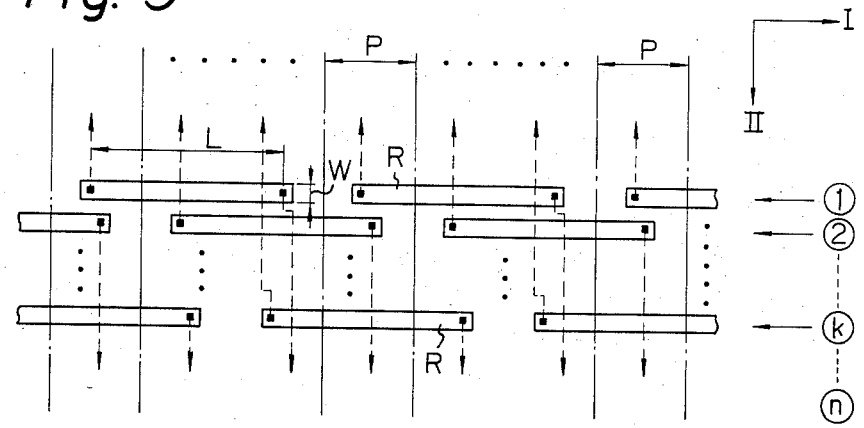
FIG. 5 is a plan view of a resistor arrangement according to the first embodiment shown in FIG. 4, but extended from three stages to n stages.

FIG. 5 is a plan view of a resistor arrangement according to the first embodiment shown in FIG. 4, however, extend from three stages to n stages. The principle behind the resistor arrangement is substantially the same as that of FIG. 4. However, in FIG. 5, the wiring pattern is more complicated than in FIG. 4.

As seen from FIGS. 4 and 5, the resistors on one stage and the resistors on another stage are arranged shifted from each other. That is, each resistor R arranged on an arbitrary k stage (k is an integer in a range of $2 \leq k \leq n$) and each resistor R arranged on a (k−1) stage adjacent to the resistor R on the k stage are shifted from each other in the first direction by rP (r is an integer in a range of $1 \leq r \leq$ (n−1) (in the example of FIG. 5, r=1). It should be noted, however, that the present invention is not restricted to such a shift between adjacent resistors of different stages.

Figure 6:
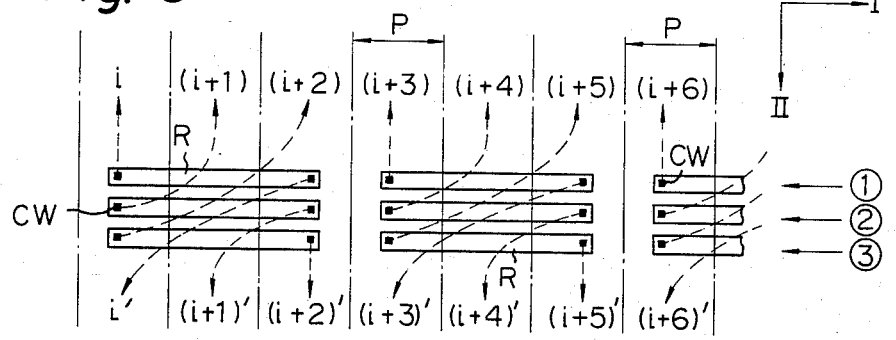
FIG. 6 is a plan view of a semiconductor device having a resistor arrangement according to a second embodiment of the present invention.

FIG. 6 is a plan view of a semiconductor device having a resistor arrangement according to a second embodiment of the present invention. This figure shows the case of a three-stage (①, ②, ③) resistor arrangement. In this embodiment, each resistor R, arranged on an arbitrary k stage (k is an integer in a range of $2 \leq k \leq n$; in this figure, n=3) and each resistor R arranged on a (k−1) stage adjacent to the resistor R on the k stage, is arranged in single file in the second direction II. In this case, since the contact windows CW of the resistors are vertically aligned, it is impossible to extend the wirings vertically as in FIG. 4 or FIG. 5. Therefore, the wiring for each contact window CW must be suitably distributed so as not to contact other contact windows CW, e.g., must be arranged as shown by the broken line arrows i, i', (i+1), (i+1)'—.

Figure 7:
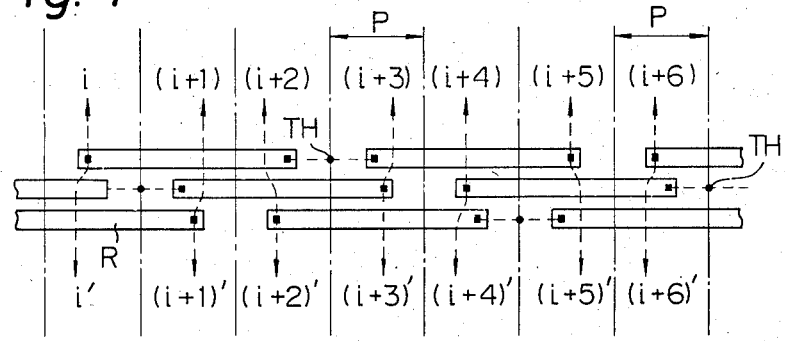
FIG. 7 is a plan view of another example of the embodiment shown in FIG. 4, where the wiring pattern of FIG. 4 is partially modified.

FIG. 7 is a plan view of another example of the embodiment shown in FIG. 4, but with a partially modified wiring pattern. As will be seen from FIG. 7, in some cases the wirings are effected from one resistor to another resistor or a through hole TH is created so as to lead the wiring to another wiring layer (not shown).

Figure 8:
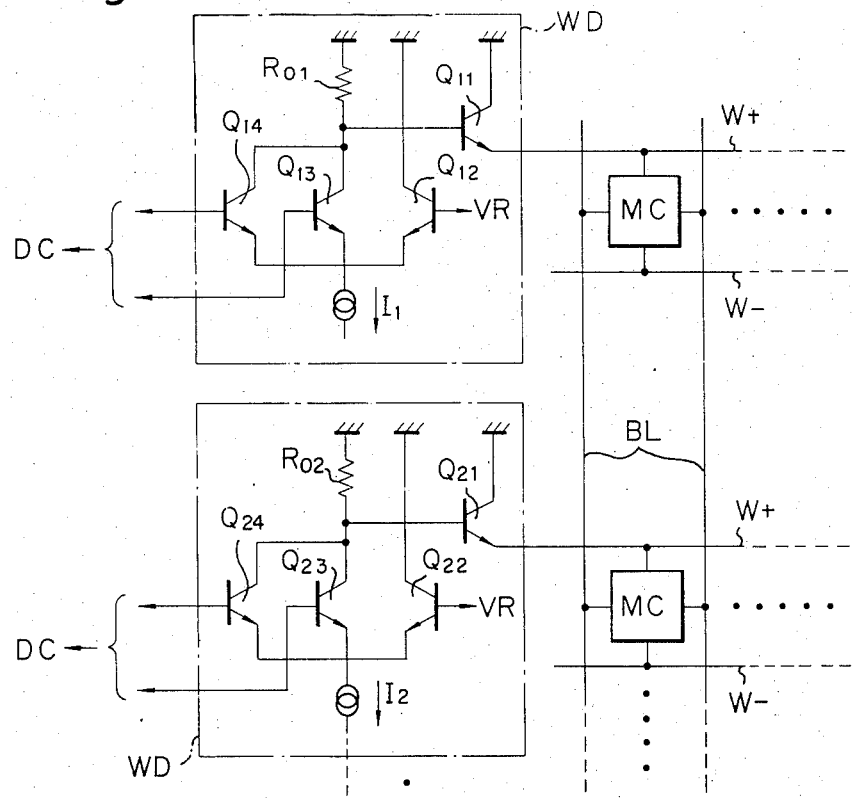
FIG. 8 is a circuit diagram of one example of an application to which the present invention can be adapted.

FIG. 8 is a circuit diagram of one example of an application to which the present invention is adapted.

The example is, to be specific, a memory circuit. Since the memory circuit itself is irrelevant to the subject of the present invention, no detailed explanation is given here. Reference characters MC represent the memory cell. As in FIG. 1, each memory cell MC is inserted between a positive side word line $W_+$ and a negative side word line $W_-$. At the same time, each memory cell MC is inserted between a pair of bit lines BL. A word driver WD is driven when the corresponding memory cell MC is to be accessed. A decoder circuit DC selects one of the word drivers to be driven. Here, the aforesaid circuit blocks correspond to these word drivers WD. The subject of the present invention resides in how the resistors $R_{01}$, $R_{02}$—in each driver WD should be arranged. Incidentally, the reference symbols $Q_{11}$ through $Q_{14}$ and $Q_{21}$ through $Q_{24}$ indicate transistors, VR a reference voltage, and $I_1$ and $I_2$ currents produced by respective constant current sources.

Figure 9:
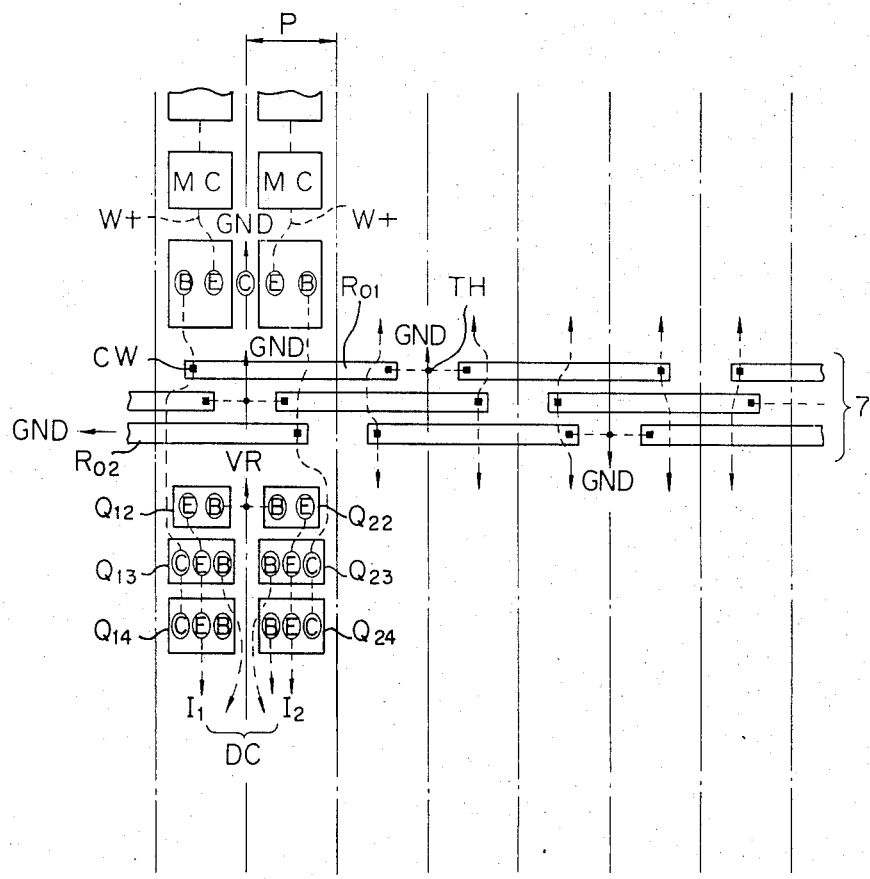
FIG. 9 is a detailed plan view of a layout of the memory circuit shown in FIG. 8.

FIG. 9 is a detailed plan view of a layout of the memory circuit shown in FIG. 8. In this layout, the resistor arrangement of FIG. 7 is employed as an example. The thus arranged resistors are located in an area 7. In FIG. 9, portions related to those of FIG. 8 are represented by the same reference characters or symbols. The characters B, E and C, enclosed by circles, represent the base, emitter and collector of each transistor, respectively. Gnd represents a ground (earth). As will be recognized from FIG. 9, the use of the resistor arrangement, i.e., the area 7, according to the present invention enables good balance in the layout of the memory circuit and, at the same time, highly dense packaging. This effect will be clear from a comparison of the aforementioned prior art resistor arrangements.

Figure 10:
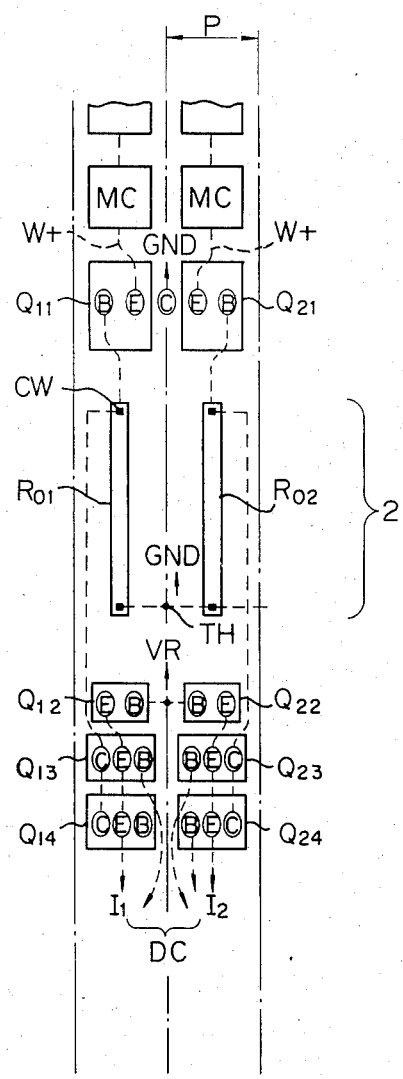
FIG. 10 is a plan view of the memory circuit, shown in FIG. 8, with a layout according to the prior art resistor arrangement of FIG. 2.

FIG. 10 is a plan view of the memory circuit shown in FIG. 8 with a layout according to the prior art resistor arrangement of FIG. 2. The resistor arrangement of FIG. 2 is employed in an area 2 of FIG. 10. A comparison of the area 2 (prior art) of FIG. 10 with the area 7 (present invention) of FIG. 9 shows that the layout of FIG. 9 enables a higher packaging density than that of FIG. 10.

As explained above in detail, according to the present invention, resistors can be arranged with high density packaging without reducing the accuracy of resistance values, thereby contributing greatly to highly dense packaging of the semiconductor device.

We claim:

1. A semiconductor device comprising:
    a plurality of circuit block regions including memory cell array block regions and peripheral circuit block regions, said memory cell block regions and said peripheral circuit block regions respectively connected to form circuit block region pairs arranged successively in a first direction and having a width P measured in the first direction; and
    a plurality of resistors arranged between and connected to said memory cell array block regions and said peripheral block regions of said circuit block region pairs, each of said plurality of resistors extending in a substantially linear manner in said first direction along the width of said circuit block region pairs and having a contact window provided at each end, said plurality of resistors formed close together and parallel to each other, and set up in the form of n (n is an integer greater than or equal to two) stages arranged in a second direction perpendicular to said first direction, each of said plurality of resistors having a length L determined by a relationship $(n-1)P < L < nP$,
    said resistors on each of said stages being shifted from each other in said first direction by an amount rP (r is an integer in a range of $1 \leq r \leq (n-1)$).

2. A semiconductor device as set forth in claim 1, further comprising wirings operatively connected to each of said resistors via said contact windows provided at each end of each of said resistors.

3. A semiconductor device as set forth in claim 1, wherein the semiconductor device is fabricated as a memory circuit, when said memory cell array block regions include memory cells and wherein said peripheral circuit block regions include word drivers, said word drivers comprised of semiconductor circuit elements and resistor elements.

* * * * *